United States Patent
Matsui

(10) Patent No.: US 11,251,585 B2
(45) Date of Patent: Feb. 15, 2022

(54) DFB WITH WEAK OPTICAL FEEDBACK

(71) Applicant: II-VI DELAWARE, INC., Wilmington, DE (US)

(72) Inventor: Yasuhiro Matsui, Milpitas, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 243 days.

(21) Appl. No.: 16/691,549

(22) Filed: Nov. 21, 2019

(65) Prior Publication Data

US 2021/0098967 A1 Apr. 1, 2021

Related U.S. Application Data

(60) Provisional application No. 62/938,151, filed on Nov. 20, 2019, provisional application No. 62/908,990, filed on Oct. 1, 2019.

(51) Int. Cl.
| | |
|---|---|
| *H01S 5/0625* | (2006.01) |
| *H01S 5/125* | (2006.01) |
| *H01S 5/026* | (2006.01) |
| *H01S 5/042* | (2006.01) |
| *H01S 5/028* | (2006.01) |
| *H01S 5/12* | (2021.01) |
| *H01S 5/14* | (2006.01) |
| *H01S 5/34* | (2006.01) |

(52) U.S. Cl.
CPC .............. *H01S 5/125* (2013.01); *H01S 5/026* (2013.01); *H01S 5/0287* (2013.01); *H01S 5/0427* (2013.01); *H01S 5/06256* (2013.01); *H01S 5/06258* (2013.01); *H01S 5/124* (2013.01); *H01S 5/141* (2013.01); *H01S 5/34* (2013.01)

(58) Field of Classification Search
CPC .... H01S 5/125; H01S 5/0287; H01S 5/06256; H01S 5/06258; H01S 5/124; H01S 5/141; H01S 5/026; H01S 5/0427
See application file for complete search history.

(56) References Cited

U.S. PATENT DOCUMENTS

| | | | |
|---|---|---|---|
| 4,908,833 | A | 3/1990 | Chraplyvy et al. |
| 10,063,032 | B2 | 8/2018 | Matsui |
| 2005/0238079 | A1 | 10/2005 | Botez |
| 2010/0265980 | A1 | 10/2010 | Matsuda |

(Continued)

FOREIGN PATENT DOCUMENTS

EP 1154533 A1 * 11/2001 ............. H01S 5/124

OTHER PUBLICATIONS

Machine translation of EP 1154533 A1 (Year: 2001).*

(Continued)

*Primary Examiner* — Yuanda Zhang
(74) *Attorney, Agent, or Firm* — Blank Rome LLP

(57) ABSTRACT

A distributed feedback plus reflection (DFB+R) laser includes an active section, a passive section, a low reflection (LR) mirror, and an etalon. The active section includes a distributed feedback (DFB) grating and is configured to operate in a lasing mode. The passive section is coupled end to end with the active section. The LR mirror is formed on or in the passive section. The etalon includes a portion of the DFB grating, the passive section, and the LR mirror. The lasing mode of the active section is aligned to a long wavelength edge of a reflection peak of the etalon.

20 Claims, 7 Drawing Sheets

(56) References Cited

U.S. PATENT DOCUMENTS

| | | |
|---|---|---|
| 2010/0272133 A1 | 10/2010 | Kato |
| 2011/0299561 A1 | 12/2011 | Akiyama |
| 2013/0308178 A1 | 11/2013 | Matsui |
| 2014/0269807 A1 | 9/2014 | Matsui |
| 2016/0064897 A1 | 3/2016 | Higa et al. |
| 2016/0164257 A1 | 6/2016 | Adachi et al. |
| 2017/0256912 A1* | 9/2017 | Matsui .................. H01S 5/34 |

OTHER PUBLICATIONS

Matsui—Book, Datacenter Connectivity Technologies: Principles and Practice, ISBN 9788793609228, River Publishers Series in Optics and Photonics, Chapter 3—"Directly Modulated Laser Technology: Past, Present, Future" River Publishers Oct. 8, 2018 (86 Pgs.).

Dumitrescu, et al., "Distributed Feedback Lasers with Photon-Photon-Resonance-Enhanced Modulation Bandwidth" Semiconductor Conference, 2012 International IEEE, Oct. 15, 2012, 4 pgs.

Radziunas, et al., "Improving the Modulation Bandwidth in Semiconductor Lasers by passive Feedback," IEEE Journal of Selected Topics in Quantum Electronics, IEEE Service Center, vol. 13, No. 1, Jan. 1, 2007, 8 pgs.

International Search Report and Written Opinion for International Application No. PCT/US2017/021014, dated May 12, 2017, 15 pgs.

Troppenz, et al., "40 Gbit/s Directly Modulated Lasers: Physics and Application" Proc. SPIE 7953, Novel In-Plane Semiconductor Lasers X, 79530F (Feb. 16, 2011) 10 pgs.

Chacinski, et al., "Effects of detuned loading on the modulation performance of widely tunable MG-Y lasers," Proc. SPIE 6997, Semiconductor Lasers and Laser Dynamics III, 699709 (May 8, 2008) 9 pgs.

Yamaoka, et al. "239.3-Gbit/s Net Rate PAM-4 Transmission Using Directly Modulated Membrane Lasers on High-Thermal-Conductivity SiC" The 45th European Conference on Optical Communication, Dublin, Sep. 22-26, 2019 4pgs.

* cited by examiner

DFB WITH WEAK OPTICAL FEEDBACK

CROSS-REFERENCE TO RELATED APPLICATIONS

This application claims the benefit of and priority to U.S. Provisional App. No. 62/908,990 filed on Oct. 1, 2019 and U.S. Provisional App. No. 62/938,151 filed on Nov. 20, 2019. The 62/908,990 application and the 62/938,151 application is each incorporated herein by reference.

FIELD

The embodiments discussed herein are related to a distributed feedback (DFB) laser with weak optical feedback.

BACKGROUND

Unless otherwise indicated herein, the materials described herein are not prior art to the claims in the present application and are not admitted to be prior art by inclusion in this section.

Lasers are useful in a number of applications. For example, lasers may be used in optical communications to transmit digital data across a fiber optic network. The laser may be modulated by a modulation signal, such as an electronic digital signal, to produce an optical signal transmitted on a fiber optic cable. An optically sensitive device, such as a photodiode, is used to convert the optical signal to an electronic digital signal transmitted through the fiber optic network. Such fiber optic networks enable modern computing devices to communicate at high speeds and over long distances.

In various industries, bitrates for data transmission per channel have surpassed 100 gigabit per second (Gb/s), establishing transmitter performance exceeding 60 gigahertz (GHz) bandwidth (BW) as an industry goal for the 100 Gb/s non-return-to zero (NRZ) format. Although some electro absorption modulators have exhibited the capability to approach 60 GHz BW, the BW of directly modulated lasers (DML) such as directly modulated DFB lasers have lagged behind at approximately 30 GHz.

The subject matter claimed herein is not limited to implementations that solve any disadvantages or that operate only in environments such as those described above. Rather, this background is only provided to illustrate one example technology area where some implementations described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some example embodiments described herein generally relate to a DFB laser with weak optical feedback, also referred to as a DFB plus reflection (DFB+R) laser.

In an example embodiment, a DFB+R laser includes a DFB section, a high reflection (HR) mirror, a passive section, and a low reflection (LR) mirror. The DFB section is configured to operate in a lasing mode. The HR mirror is coupled to a rear of the DFB section. The passive section is coupled to a front of the DFB section. The LR mirror is formed at a front of the passive section. The passive section, a portion of the DFB section at the front of the DFB section, and the LR mirror form an etalon having a reflection profile with periodic peaks and valleys. The lasing mode of the DFB section is aligned to a long wavelength edge of one of the periodic peaks of the reflection profile of the etalon.

In another example embodiment, a DFB+R laser includes an active section, a passive section, a LR mirror, and an etalon. The active section includes a DFB grating and is configured to operate in a lasing mode. The passive section is coupled end to end with the active section. The LR mirror is formed on or in the passive section. The etalon includes a portion of the DFB grating, the passive section, and the LR mirror. The lasing mode of the active section is aligned to a long wavelength edge of a reflection peak of the etalon.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

This application is related to U.S. Pat. No. 10,063,032 issued Aug. 28, 2018 and which is incorporated herein by reference.

Embodiments described herein leverage the detuned-loading effect to improve performance of a DFB laser by inclusion in the DFB laser of a passive section with weak optical feedback. The detuned loading effect will first be described in the context of a distributed Bragg reflector (DBR) laser followed by discussion of its applicability to DFB lasers.

Figure 1:
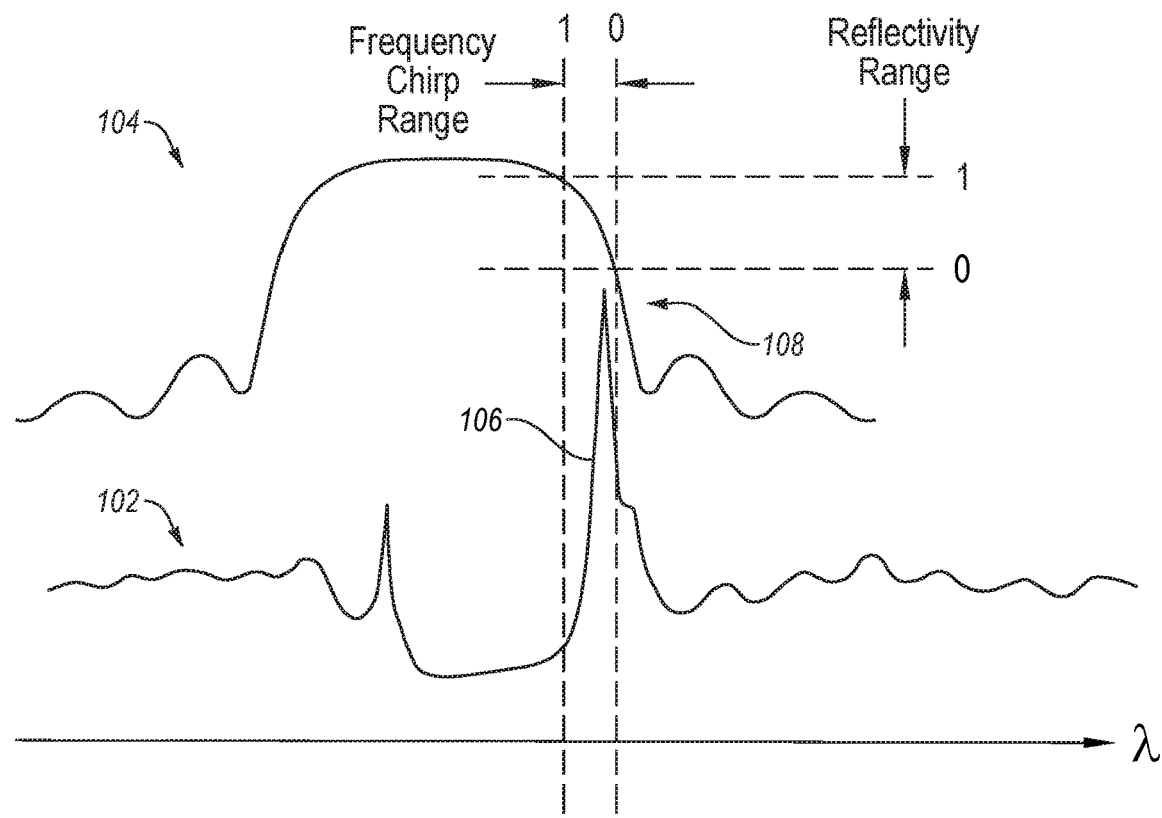
FIG. 1 illustrates an example modulation spectrum of an active section of a laser relative to a DBR reflection profile of a DBR section of the laser.

FIG. 1 illustrates an example modulation spectrum 102 of an active section of a laser relative to a DBR reflection profile 104 of a DBR section of the laser, arranged in accordance with at least one embodiment described herein. As illustrated, a main lasing mode 106 of the modulation spectrum 102 is aligned to a long wavelength edge 108 of a peak of the DBR reflection profile 104. Accordingly, lasing of the active section occurs at a frequency (or wavelength) on the long wavelength edge of the DBR stop-band.

When the laser is modulated (e.g., through modulation of the active section), lasing frequency changes due to frequency chirp toward shorter wavelength as the modulation goes from the bias for the 0 bits to the bias for the 1 bits and toward longer wavelength as the modulation goes from the bias for the 1 bits to the 0 bits. The frequency/wavelength of the main lasing mode 106 for each of the 1 and 0 bits is designated in FIG. 1 by a corresponding vertical dashed line labeled with, respectively, a 1 or a 0.

The frequency chirp caused by modulation results in a change in reflection as the main lasing mode 106 moves up and down the long wavelength edge of the reflection profile 104. In particular, when the modulation goes from the bias for the 0 bits to the 1 bits, the wavelength of the main lasing mode 106 shifts toward shorter wavelength resulting in increased reflection and thus lower cavity loss. When the modulation goes from the bias for the 1 bits to the 0 bits, the wavelength of the main lasing mode 106 shifts toward longer wavelength resulting in decreased reflection and thus higher cavity loss. The reflectivity of the DBR region of the laser at the wavelengths corresponding to each of the 1 and 0 bits is designated in FIG. 1 by a corresponding horizontal dashed line labeled with, respectively, a 1 or a 0.

In more detail, rapid current modulation of the active section of the laser induces carrier density variations in the laser. This gives rise not only to optical gain fluctuations but also index fluctuations due to the so called alpha-parameter of the material. These gain and index-fluctuations give in turn rise to intensity and frequency fluctuations of the laser light, respectively. The relative amount of frequency modulation compared to the intensity modulation of the laser is described by the chirp factor, also called the alpha-parameter or linewidth enhancement factor of the structure. When the laser is detuned so that the lasing mode 106 is located on the long-wavelength edge of the peak of the reflection profile 104, the index modulation gives rise to modulation of the cavity losses which decreases or increases the effective (netgain) modulation of the laser. Thus, laser chirp is translated into an effective enhancement of the differential gain, and thus improves the speed of the laser. The detuned-loading effect includes the effect(s) that occur under modulation when the lasing mode 106 is aligned to the long-wavelength edge of the peak of the DBR reflection profile 104, which may include one or more of effective enhancement of the differential gain, improved speed, and increased bandwidth.

The detuned-loading effect is not limited to DBR lasers. Indeed, the detuned-loading effect may be implemented in semiconductor lasers in which the lasing mode is aligned to the long wavelength edge of a peak of a reflection profile of a portion of the semiconductor laser according to at least some embodiments.

Figure 2:
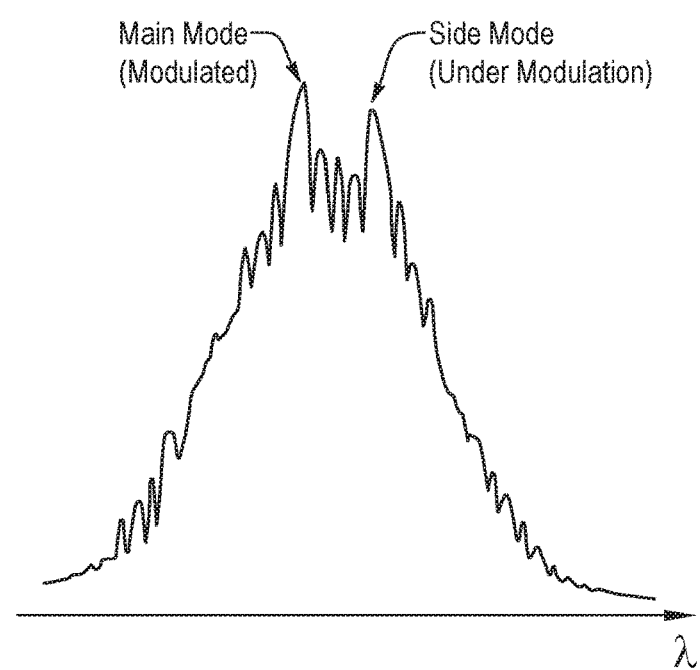
FIG. 2 illustrates a directly modulated laser (DML) modulation spectrum with the photon-photon resonance effect.

Embodiments described herein may additionally leverage the photon-photon resonance (PPR) effect to improve performance. When a DML such as a DFB laser or DBR laser is modulated, modulation sidebands broaden the spectrum of the DML around the main lasing mode. If the side mode of the laser cavity is present within the modulation spectrum, such sidebands can be coupled into the side mode and be resonantly amplified. This situation is depicted in FIG. 2. This effect is called the PPR effect and can enhance the modulation response at around a frequency corresponding to the frequency difference between the main and side modes. The frequency separation between the lasing mode and the PPR mode may be referred to as the PPR frequency. Embodiments described herein may have a PPR frequency in a range from 25 GHz to 100 GHz, such as about 30 GHz, or in a range from 50 GHz to 100 GHz, or other suitable PPR frequency. For example, for cooled applications, the PPR frequency may be in a range from 50 GHz to 100 GHz. As another example, for a 50 gigabaud uncooled application, the bandwidth of the laser may be about 35 GHz and the PPR frequency may be about 30 GHz.

Embodiments described herein include DFB lasers with a passive section with weak optical feedback, the DFB lasers configured to leverage the detuned-loading effect. DFB lasers with a passive section are known, but such known DFB lasers do not leverage the detuned-loading effect.

Figure 9:
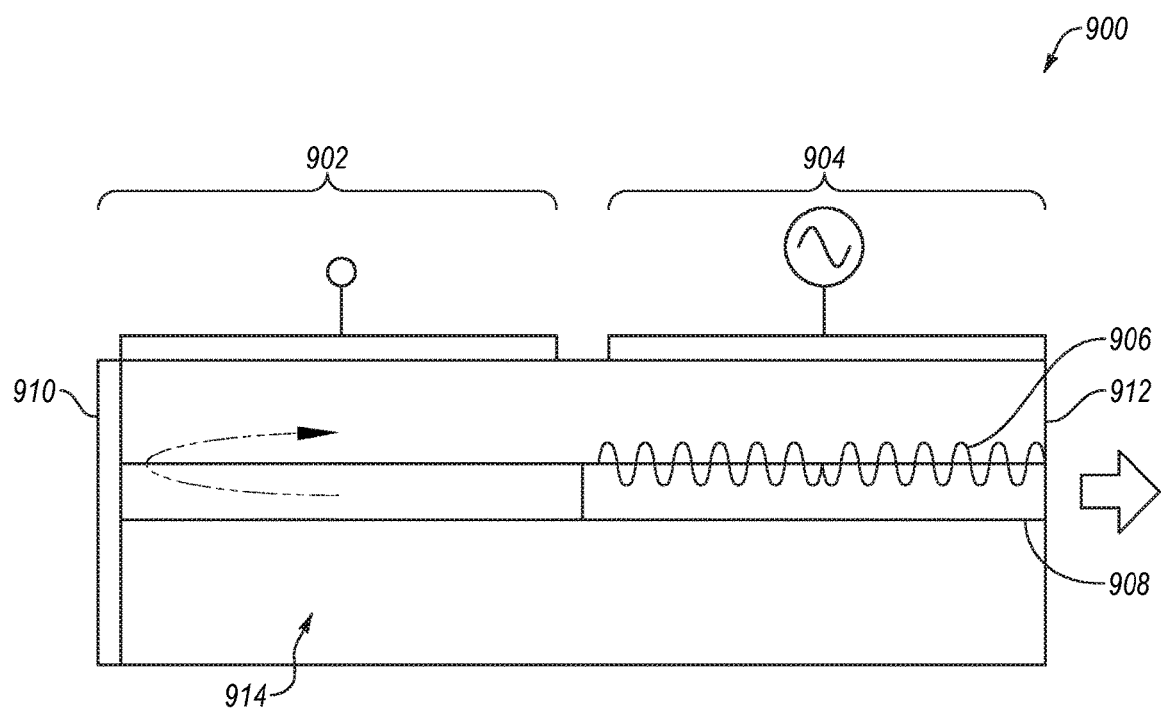
FIG. 9 illustrates a prior art DFB laser with a passive section and a DFB section.
Figure 9:
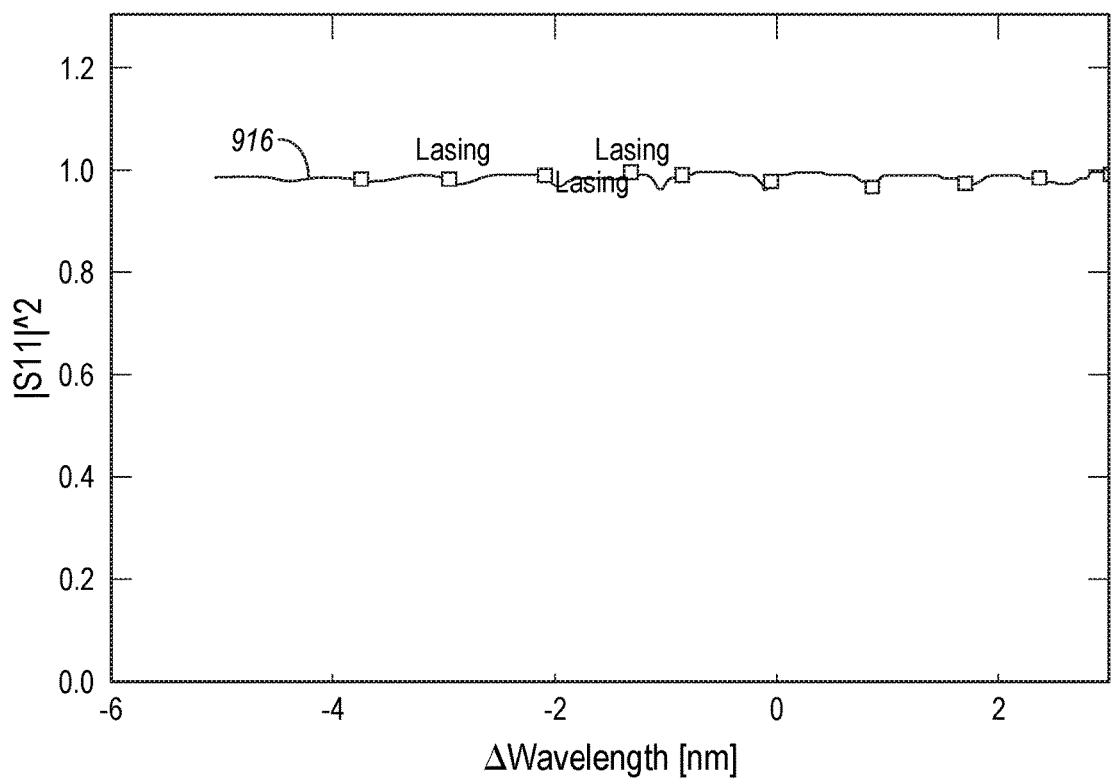

FIG. 9 illustrates a prior art DFB laser 900 with a passive section 902 and a DFB section 904. The DFB laser 900 may be referred to as a passive feedback laser (PFL) 900. The DFB section 904 includes a DFB grating 906 etched into a multiple quantum well (MQW) gain layer 908. A high reflection (HR) mirror 910, e.g., with a reflectivity of 95%, is formed on a rear facet of the passive section 902. An anti reflection (AR) coating 912 is formed on a front facet of the DFB section 904. An etalon 914 is formed in the passive section 902 by the HR mirror 910 and a portion of the DFB grating 906 at the rear of the DFB section 904. The DFB grating 906 has a strong kappa of about 500 cm$^{-1}$. Strong reflection from the HR mirror 910 degrades the side-mode suppression ratio (SMSR) unless strong kappa is used. The configuration of the PFL 900 with the HR mirror 910 and the DFB grating 906 with strong kappa excites an external cavity mode which can resonantly amplify the modulation sidebands of the DFB mode (e.g., the PPR effect), resulting in a 37 GHz modulation BW at 1310 nm. The speed improvement in the PFL 900 is mainly due to the PPR effect, and the carrier-photon resonance frequency ($F_r$) is relatively low, e.g., 12 GHz. The strong kappa of the DFB grating 906 stabilizes the DFB mode even when the HR mirror 910 produces strong feedback. The DFB grating 906 is etched directly into the MQW layer 908 which may degrade gain properties and reliability. The MQW layer 908 may include InGaAsP; InGaAlAs cannot be used in the MQW layer 908 due to Al oxidation.

FIG. 9 additionally illustrates a reflection profile 916 of the etalon 914. The reflection profile 916 is substantially flat due to the HR mirror 910. In particular, the etalon 914 works as an all-pass filter or Gires-Tournois (GT) interferometer, which generally modifies dispersion as a function of wavelength but does not generally modify reflection as a function of wavelength. As a result of the flatness of the reflection profile caused by the HR mirror 910, there is insufficient filter edge to which the lasing mode may be aligned to provide a pronounced detuned-loading effect, substantially eliminating the detuned-loading effect in the PFL 900.

The strong kappa of the DFB grating 906 in the PFL 900 further reduces or eliminates the detuned-loading effect in the PFL 900. In particular, the strong kappa reduces the influence of reflected light on the threshold gain of the active section 904.

Figure 3:
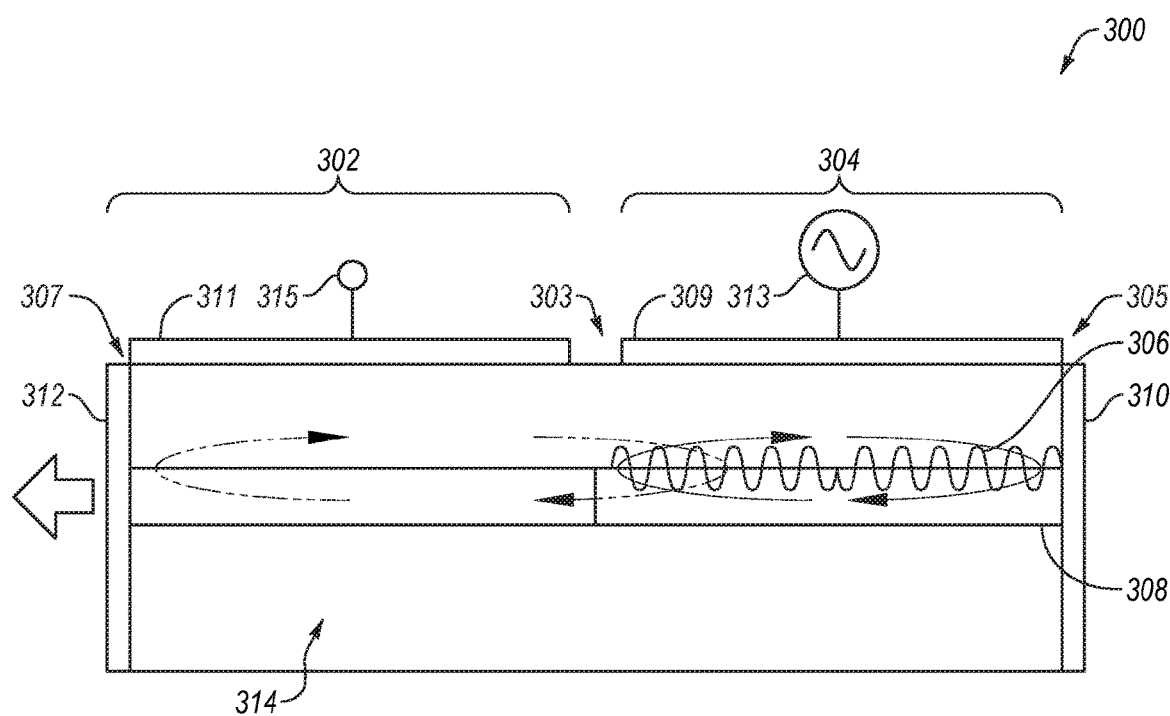
FIG. 3 illustrates an example DFB+R laser configured to leverage the detuned-loading effect.

FIG. 3 illustrates an example DFB laser 300 configured to leverage the detuned-loading effect, arranged in accordance with at least one embodiment described herein. As illustrated, the DFB laser 300 includes a passive section 302 and a DFB section 304 (also referred to as an active section). The passive section 302 is coupled to a front 303 of the DFB section 304. The passive section 302 may have a length in a range from 100 to 250 micrometers, such as 120 micrometers. The DFB section 304 may have a length in a range from 50 to 200 micrometers, such as 100 micrometers.

The DFB section 304 may include a DFB grating 306 formed in, on, or above a MQW gain layer 308 or other suitable gain layer. The DFB grating 306 may include first and second grating portions with a phase shift in between. The DFB grating 306 may have a kappa×length, e.g., κL, in a range from 1.0 to 1.8, or other suitable κL.

An HR mirror 310 is formed at a rear or back 305, e.g., on a rear facet, of the DFB section 304. The HR mirror 310 may be coupled to the rear 305 of the DFB section 304. The HR mirror 310 may have a reflectivity of 30% or more, 50% or more, 70% or more, or even 90% or more. In other embodiments, a DBR mirror with similar reflectivity (e.g., of 30% or more, 50% or more, 70% or more, or even 90% or more) may be substituted for the HR mirror 310 and may be referred to as an HR DBR mirror. The term "HR mirror" as used herein encompasses HR coatings/mirrors as well as HR DBR mirrors.

A low reflection (LR) mirror 312 is formed at a front 307, e.g., on a front facet, of the passive section 302. The LR mirror 312 may be coupled to the front 307 of the passive section 302. The LR mirror 312 may have a reflectivity of 15% or less, 10% or less, or even 5% or less, such as 4% or 3%. In some embodiments, the LR mirror 312 has a reflectivity in a range from 0.5% to 15% or in a range from 3% to 8%. An etalon 314 is formed between a portion of the DFB grating 306 at the front of the DFB section 304 and the LR mirror 312. The DFB laser 300 forms a complex-cavity design consisting of a DFB laser itself, e.g., the DFB section 304, and the etalon 314. The etalon 314 is configured to modify cavity loss dynamically due to frequency chirp as the DFB section 304 is modulated. The DFB laser 300 may be referred to as a DFB+R (e.g., DFB plus (weak) reflection) laser 300.

The DFB+R laser 300 may additionally include a modulation contact 309 and a bias contact 311 electrically coupled to, respectively, the DFB section 304 and the passive section 302. A modulation signal 313 may be provided through the modulation contact 309 to the DFB section 304 to modulate the DFB section 304. A bias signal 315 may be provided through the bias contact 311 to the passive section 302. Modulation of the DFB section 304 may modulate the cavity loss of the DFB+R laser 300 and may increase a $F_r$ of the DFB+R laser 300.

Figure 4:
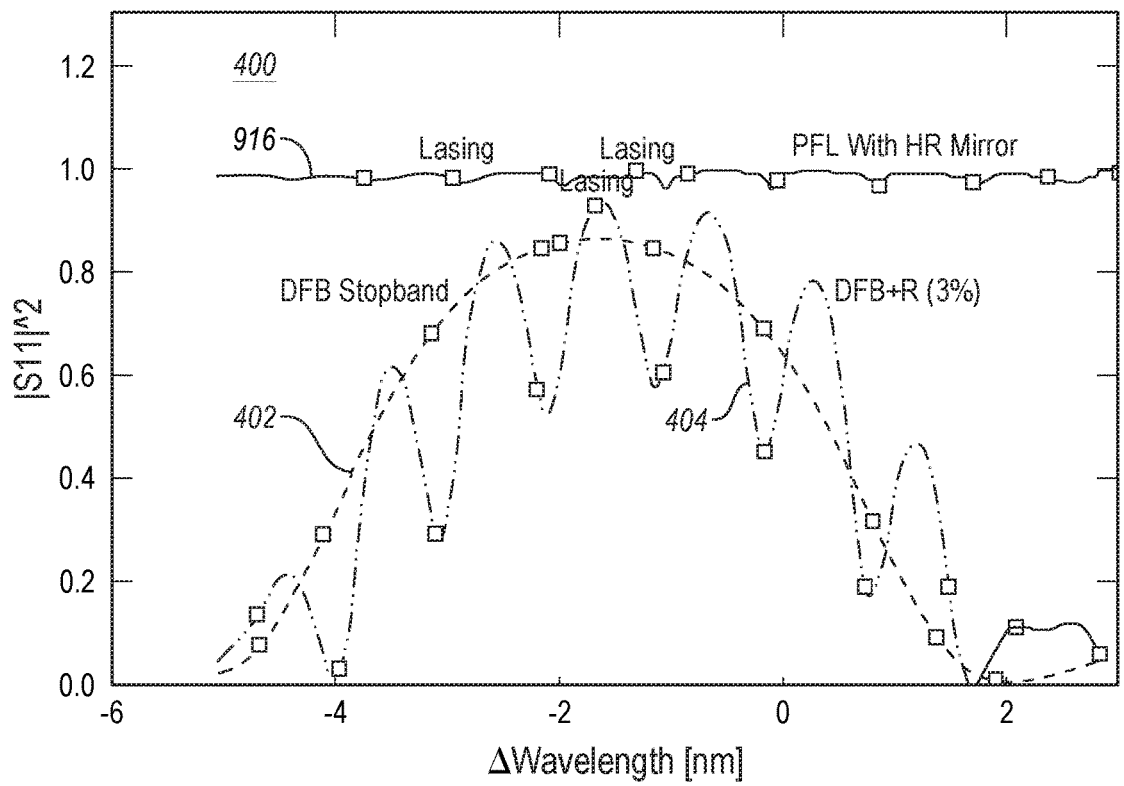
FIG. 4 illustrates various reflection profiles associated with a laser of FIG. 9 and the DFB+R laser of FIG. 3.

FIG. 4 illustrates various reflection profiles 400 associated with the PFL laser 900 of FIG. 9 and the DFB+R laser 300 of FIG. 3, arranged in accordance with at least one embodiment described herein. The reflection profiles 300 include the reflection profile 916 of the etalon 914 of the PFL 900 of FIG. 9 (hereinafter PFL reflection profile 916), a reflection profile 402 of the DFB grating 306 (hereinafter DFB reflection profile 402), and a reflection profile 404 of the combined DFB grating 306 and the LR mirror 312 (with a reflectivity of 3%) (hereinafter combined DFB+R reflection profile 404) when seen from the DFB section 304 toward the output of the DFB+R laser 300. As illustrated by the DFB+R reflection profile 404 in FIG. 4, the etalon 314 formed by the DFB grating 306 and the LR mirror 312 produces strong ripples and hence a strong detuned-loading effect. In comparison, the ripples disappear in the PFL reflection profile 916 where the waveguide loss is small because the etalon 914 with the HR mirror 910 acts as a GT interferometer. Therefore, there is only a dispersion effect in the PFL laser 900, and the detuned-loading effect in the imaginary part vanishes when the HR coating 910 is applied to the facet of the passive section 902 opposite the DFB section 904.

Figure 5:
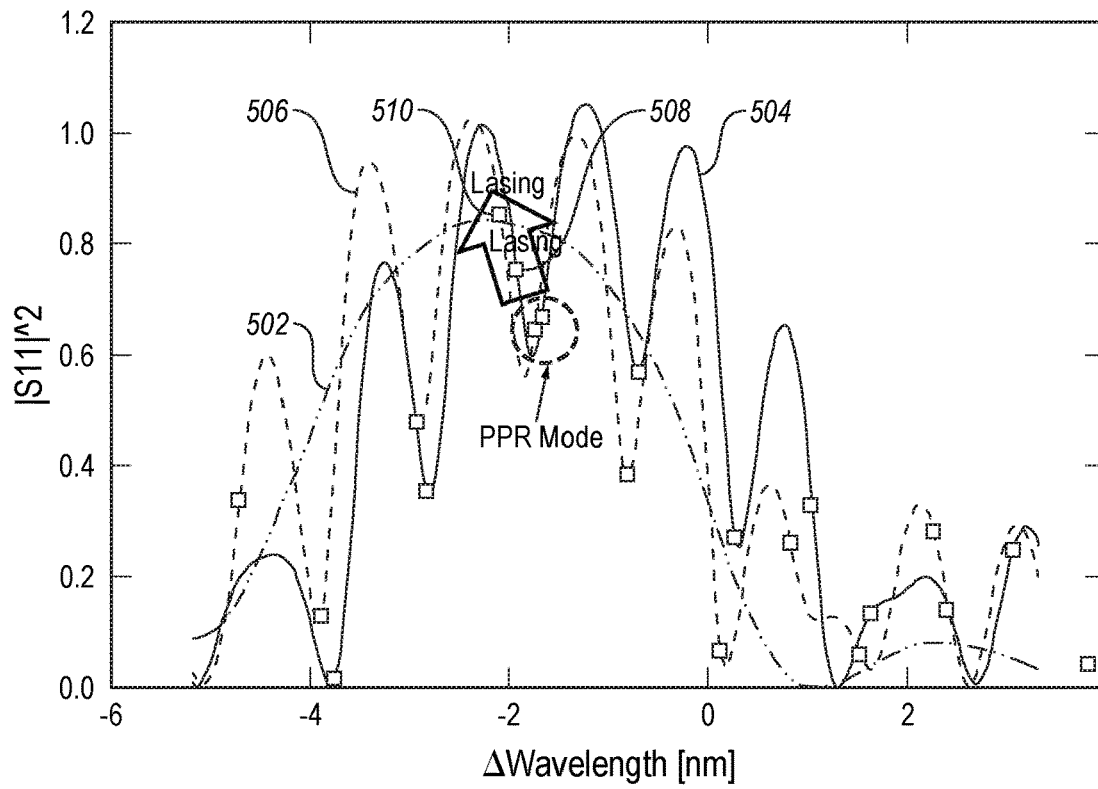
FIG. 5 illustrates various reflection profiles of another example DFB+R laser.
Figure 5:
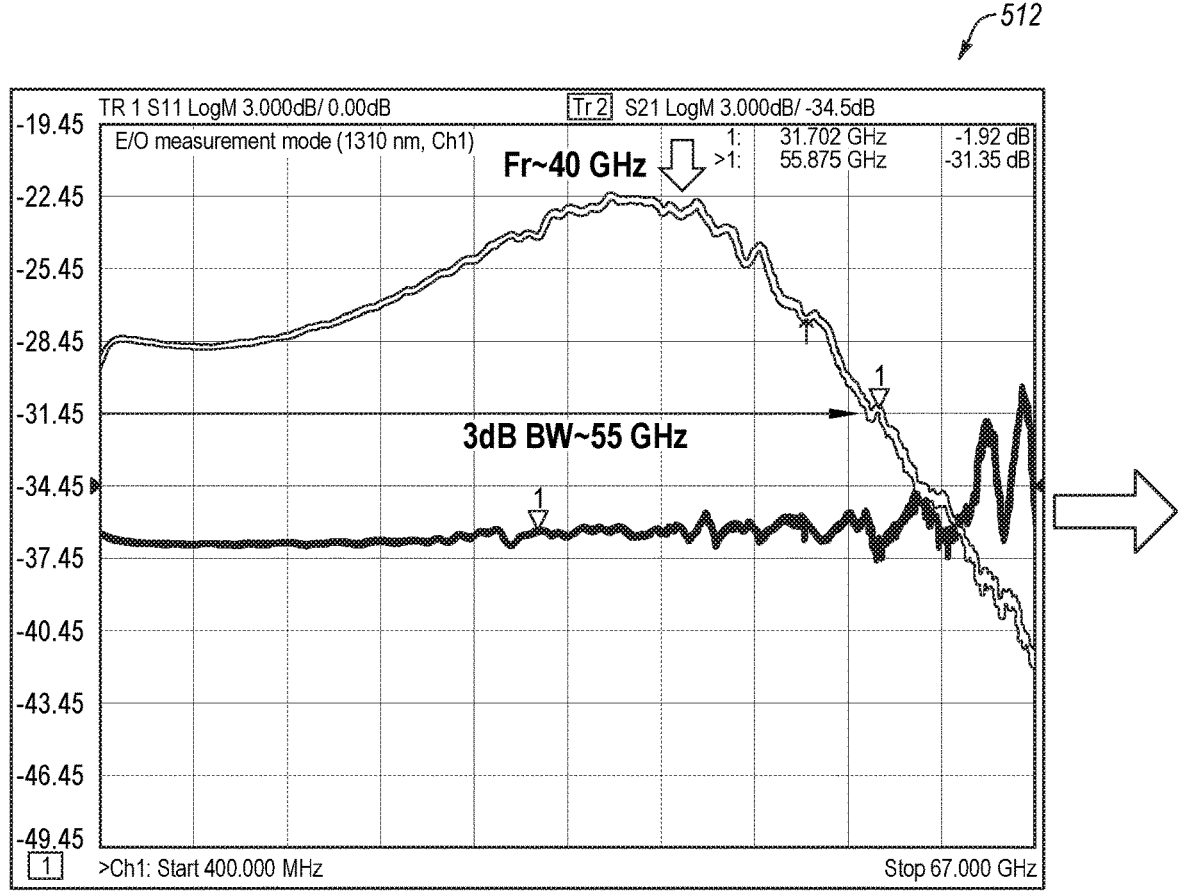

FIG. 5 illustrates various reflection profiles 502, 504, 506 of another example DFB+R laser, arranged in accordance with at least one embodiment described herein. The DFB+R laser may be the same as or similar to the DFB+R laser 300 of FIG. 3 where a LR mirror of the DFB+R laser of FIG. 5 has a reflectivity of 4%.

The reflection profile 502 is a reflection profile of a DFB grating of the DFB+R laser (hereinafter DFB reflection profile 502). The reflection profile 504 is a reflection profile of the combined DFB grating and the LR mirror (with a reflectivity of 4%) at low bias (hereinafter combined low bias DFB+R reflection profile 504) when seen from the DFB section toward the output of the DFB+R laser. The reflection profile 506 is a reflection profile of the combined DFB grating and the LR mirror (with a reflectivity of 4%) at high bias (hereinafter combined high bias DFB+R reflection profile 506) when seen from the DFB section toward the output of the DFB+R laser. There is a shift from the combined low bias DFB+R reflection profile 504 to the combined high bias DFB+R reflection profile 504 when the bias increases due to gain compression of the DFB+R laser. This shift is smaller than the frequency chirp that occurs under modulation since the index of the passive section does not change dynamically.

As illustrated in FIG. 5, each of the combined DFB+R reflection profiles 504, 506 has periodic reflection peaks (or ripples) and valleys and a main lasing mode 508 of the DFB section is aligned to a long wavelength edge of one of the periodic peaks. The edge of the peak to which the main lasing mode 508 is aligned may be relatively steep. For instance, the edge of the peak may have a slope of at least 0.002 $GHz^{-1}$, such as a slope of about 0.006 $GHz^{-1}$, at the main lasing mode 508. In some embodiments, the slope may be in a range from 0.002 $GHz^{-1}$ to 0.009 $GHz^{-1}$. When the DFB+R laser is intensity modulated from intensity corresponding to 1 bits to intensity corresponding to 0 bits, frequency chirp shifts the main lasing mode 508 to shorter wavelength, e.g., to chirped lasing mode 510. The frequency chirp increases the reflectivity of the etalon of the DFB+R laser, and therefore dynamically reduces the loss of cavity. This is an effective increase in the differential gain, and therefore the speed of laser is improved according to the detuned-loading effect. Thus, in some embodiments, modulation of the DFB section of a DFB+R laser as described herein modulates cavity loss of the DFB+R laser and increases intrinsic speed of the DFB+R laser.

FIG. 5 additionally illustrates a PPR mode for each of the combined low and high bias DFB+R reflection profiles 504, 506 on the long wavelength side of the main lasing mode 508. The PPR frequency may be in a range from 50 GHz to 100 GHz. Thus, FIG. 5 illustrates that the detuned-loading effect and the PPR effect may co-exist for embodiments of the DFB+R laser described herein, unlike the PFL 900 of FIG. 9 which uses the PPR effect but not the detuned-loading effect.

FIG. 5 further illustrates the 3 dB BW and $F_r$ at 25 C of a DFB+R laser as described herein where the LR mirror has a reflectivity of 5%, the DFB section has a length of 80 micrometers, and the passive section has a length of 120 micrometers. As illustrated, the DFB+R laser has a $F_r$ of about 40 GHz and a 3 dB BW of about 55 GHz.

Figure 6:
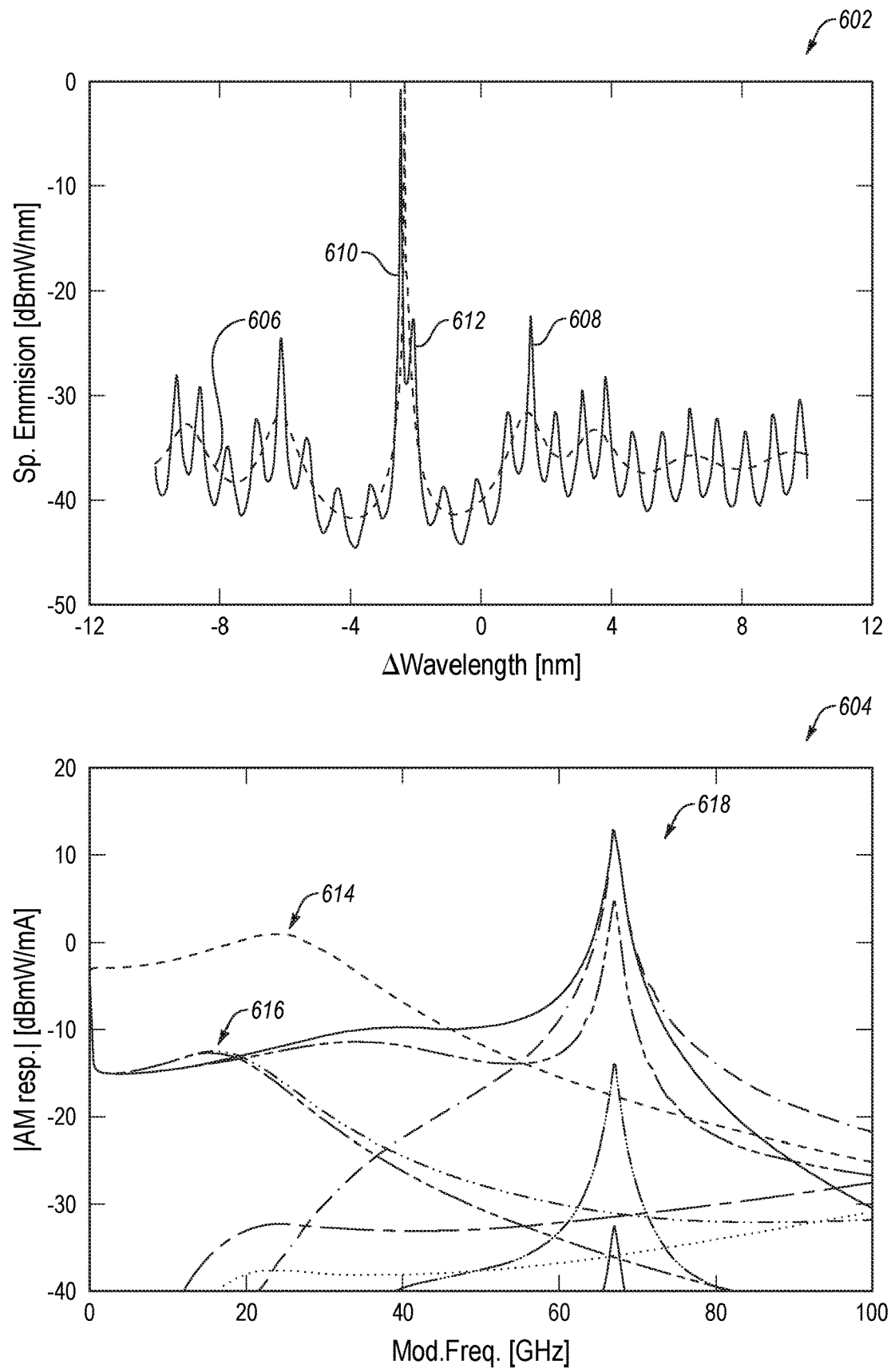
FIG. 6 illustrates various spectra and S21 responses of a DFB+R laser.

FIG. 6 illustrates various spectra 602 and S21 responses 604 of a DFB+R laser, arranged in accordance with at least one embodiment described herein. The spectra 602 include a modulation spectrum 606 of a DFB section such as may be implemented in the DFB+R laser but without feedback, e.g., from an etalon of the DFB+R laser. The spectra 602 also include a modulation spectrum 608 of the DFB+R laser (e.g., the same DFB section associated with the modulation spectrum 606 but with feedback from the etalon). The modulation spectrum 606 of the DFB section without feedback has a main lasing mode 610 and a PPR mode 612. The SMSR may be greater than 40 dB for reflectivity of the LR mirror of 5%.

The S21 responses 604 include a S21 response 614 of a conventional DFB laser (e.g., without etalon feedback) and various S21 responses 616 of the DFB+R laser where a phase shift in the passive section imparted to light traveling in the DFB+R laser is about 180 degrees, resulting in the lasing mode being aligned to the short wavelength side of one of the etalon ripples and degraded performance. The S21 responses additionally include various S21 responses 618 where the phase shift in the passive section imparted to light traveling in the DFB+R laser is tuned to about 20 degrees, resulting in the lasing mode being aligned to the long wavelength side of one of the etalon ripples and enhanced speed, e.g., faster $F_r$. As illustrated by the S21 responses 604, aligning the main lasing mode to the short wavelength side of one of the etalon ripples degrades performance (slower $F_r$) relative to conventional DFB lasers, while aligning the main lasing mode to the long wavelength side of one of the etalon ripples enhances performance (faster $F_r$) relative to conventional DFB lasers.

Figure 7:
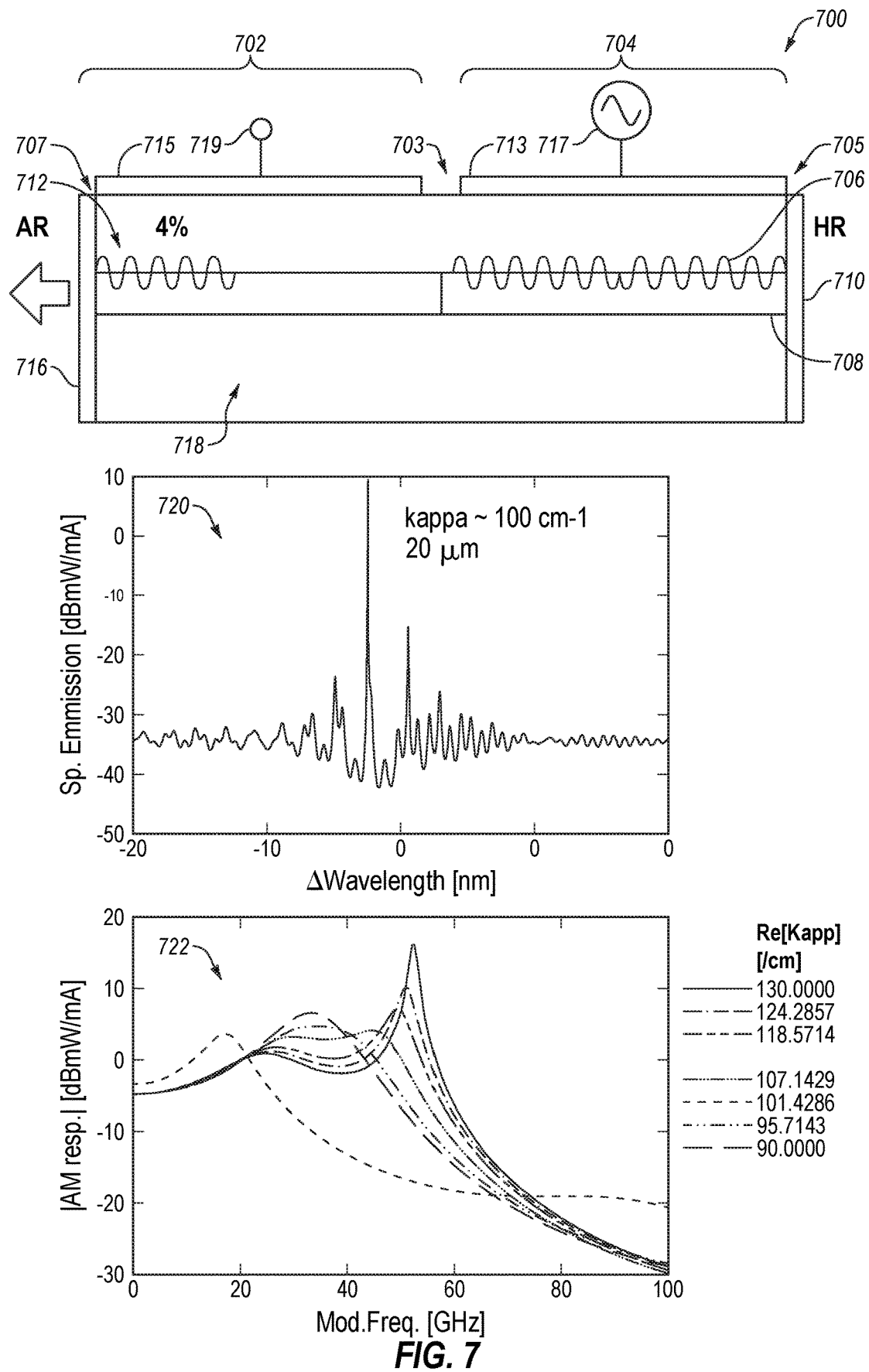
FIG. 7 illustrates another example DFB+R laser configured to leverage the detuned-loading effect.

FIG. 7 illustrates another example DFB+R laser 700 configured to leverage the detuned-loading effect, arranged in accordance with at least one embodiment described herein. As illustrated, the DFB+R laser 700 includes a passive section 702 and a DFB section 704 (also referred to as an active section). The passive section 702 is coupled to a front 703 of the DFB section 704. The passive section 702 may have a length in a range from 100 to 250 micrometers, such as 120 micrometers. The DFB section 704 may have a length in a range from 50 to 200 micrometers, such as 100 micrometers.

The DFB section 704 may include a DFB grating 706 formed in, on, or above a MQW gain layer 708 or other suitable gain layer. The DFB grating 706 may include first and second grating portions with a phase shift in between. The DFB grating 706 may have a κL in a range from 0.5 to 2.0 or other suitable value.

An HR mirror 710 is formed at a rear or back 705, e.g., on a rear facet, of the DFB section 704. The HR mirror 710 may be coupled to the rear 705 of the DFB section 704. The HR mirror 710 may have a reflectivity of 30% or more, 50% or more, 70% or more, or even 90% or more. In other embodiments, a DBR mirror with similar reflectivity (e.g., of 30% or more, 50% or more, 70% or more, or even 90% or more) may be substituted for the HR mirror 710 and may be referred to as an HR DBR mirror.

A low reflection (LR) mirror 712 is formed at a front 707 of the passive section 702, e.g., in the passive section 702 near a front facet or output facet of the DFB+R laser 700. The LR mirror 712 may be coupled to the front 707 of the passive section 702. The LR mirror 712 may have a reflectivity of 15% or less, 10% or less, or even 5% or less, such as 4% or 3%. In some embodiments, the LR mirror 712 has a reflectivity in a range from 0.5% to 15% or in a range from 3% to 8%. In the example of FIG. 7, the LR mirror 712 includes a LR DBR formed in the passive section 702. A length of the LR DBR of the LR mirror 712 may be relatively short, such as 20 micrometers or less. A kappa of the LR DBR of the LR mirror 712 may be 50 cm$^{-1}$ or more. An AR coating 716 may be formed on the output facet of the DFB+R laser 700.

Analogous to the example of FIG. 3, an etalon 718 is formed between a portion of the DFB grating 706 at the front of the DFB section 704 and the LR mirror 712. The DFB+R laser 700 forms a complex-cavity design consisting of a DFB laser itself, e.g., the DFB section 704, and the etalon 714. The etalon 714 is configured to modify cavity loss dynamically due to frequency chirp as the DFB section 704 is modulated. Accordingly, the DFB+R laser 700 of FIG. 7 may leverage the detuned-loading effect to improve performance.

The DFB+R laser 700 may additionally include a modulation contact 713 and a bias contact 715 electrically coupled to, respectively, the DFB section 704 and the passive section 702. A modulation signal 717 may be provided through the modulation contact 713 to the DFB section 704 to modulate the DFB section 704. A bias signal 719 may be provided through the bias contact 715 to the passive section 702. Modulation of the DFB section 704 may modulate the cavity loss of the DFB+R laser 700 and may increase a $F_r$ of the DFB+R laser 700.

FIG. 7 also illustrates a modulation spectrum 720 and various S21 responses 722 of the DFB+R laser 700. As illustrated by the modulation spectrum 720, the DFB+R laser 700 suppresses modes outside of a broadband DBR mirror (~10 nanometer width).

The S21 responses 722 include various S21 responses of the DFB+R laser 700 at different kappas for the LR DBR of the LR mirror 712. As illustrated, the peaks of the S21 responses 722 generally become more pronounced and shift to higher frequency with higher kappa.

Figure 8:
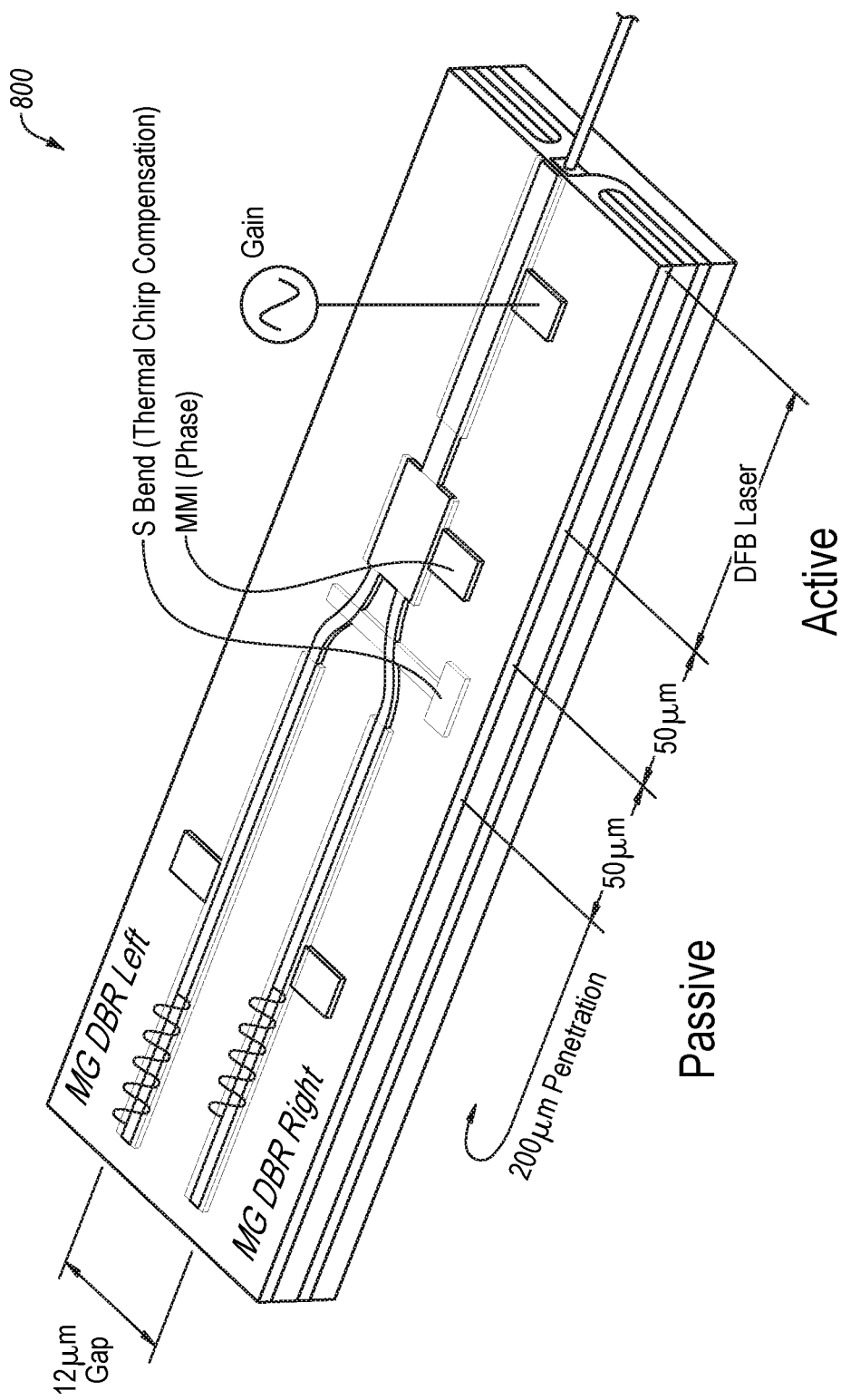
FIG. 8 illustrates another example DFB+R laser configured to leverage the detuned-loading effect.

FIG. 8 illustrates another example DFB+R laser 800 configured to leverage the detuned-loading effect, arranged in accordance with at least one embodiment described herein. The DFB+R laser includes a modulated grating y-branch (MGY) laser configuration, e.g., two modulated grating branches (MG DBR Left and MG DBR Right in FIG. 8) coupled through a passive section including S bends and a multimode interference (MMI) coupler to a DFB laser.

The MG DBR Left and Right branches may each include a corresponding DBR grating, each of which may be located at different distances from the DFB laser to excite multiple PPR at various frequencies to extend the response.

The MMI coupler may include a 1×2, 1×3, or more generally 1×n (where n is an integer) MMI coupler.

The lasing mode of the DFB laser may be aligned to a long wavelength edge of a reflection profile of the MG DBR Left and Right branches to leverage the detuned-loading effect.

Unless specific arrangements described herein are mutually exclusive with one another, the various implementations described herein can be combined to enhance system functionality or to produce complementary functions. Likewise, aspects of the implementations may be implemented in standalone arrangements. Thus, the above description has been given by way of example only and modification in detail may be made within the scope of the present invention.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B."

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A distributed feedback plus reflection (DFB+R) laser, comprising:
   a distributed feedback (DFB) section configured to operate in a lasing mode;
   a high reflection (HR) mirror coupled to a rear of the DFB section;
   a passive section coupled to a front of the DFB section; and
   a low reflection (LR) mirror formed at a front of the passive section;
   wherein the passive section, a portion of the DFB section at the front of the DFB section, and the LR mirror form an etalon having a reflection profile with periodic peaks and valleys, and wherein the lasing mode of the DFB section is aligned to a long wavelength edge of one of the periodic peaks of the reflection profile of the etalon.

2. The DFB+R laser of claim 1, wherein the LR mirror has a reflectivity of 15% or less.

3. The DFB+R laser of claim 1, wherein the LR mirror has a reflectivity of 10% or less.

4. The DFB+R laser of claim 1, wherein the passive section is configured to impart a phase shift of about 20 degrees to light propagating in the DFB+R laser.

5. The DFB+R laser of claim 1, wherein the HR mirror has a reflectivity of 30% or more.

6. The DFB+R laser of claim 1, further comprising a modulation contact coupled to the DFB section and configured to provide a modulation signal to the DFB section to modulate the DFB section, wherein modulation of the DFB section modulates cavity loss of the DFB+R laser and increases carrier-photon resonance frequency ($F_r$) of the DFB+R laser.

7. The DFB+R laser of claim 1, wherein a length of the passive section is in a range from 100 micrometers to 250 micrometers.

8. The DFB+R laser of claim 1, wherein the HR mirror comprises a HR distributed Bragg reflector (DBR) mirror.

9. The DFB+R laser of claim 1, further comprising a photon-photon resonance frequency of at least 25 gigahertz.

10. A distributed feedback plus reflection (DFB+R) laser, comprising:
    an active section that includes a distributed feedback (DFB) grating and that is configured to operate in a lasing mode;
    a passive section coupled end to end with the active section;
    a low reflection (LR) mirror formed on or in the passive section; and
    an etalon that includes a portion of the DFB grating, the passive section, and the LR mirror,
    wherein the lasing mode of the active section is aligned to a long wavelength edge of a reflection peak of the etalon.

11. The DFB+R laser of claim 10, wherein the long wavelength edge of the reflection peak of the etalon has a slope greater than 0.002 gigahertz$^{-1}$ (GHz$^{-1}$) at the lasing mode.

12. The DFB+R laser of claim 10, wherein the LR mirror comprises a LR coating formed on an output facet of the DFB+R laser.

13. The DFB+R laser of claim 10, wherein the LR mirror comprises a LR distributed Bragg reflector (DBR) formed in the passive section, the DFB+R laser further comprising an antireflection coating formed on an output facet of the passive section.

14. The DFB+R laser of claim 13, wherein a length of the LR DBR is 20 micrometers or less.

15. The DFB+R laser of claim 13, wherein a kappa of the LR DBR is at least 50 centimeter$^{-1}$ (cm$^{-1}$).

16. The DFB+R laser of claim 10, wherein the LR mirror has a reflectivity of 5% or less.

17. The DFB+R laser of claim 10, further comprising a HR mirror formed at a rear of the DFB section, wherein the HR mirror has a reflectivity of 30% or more.

18. The DFB+R laser of claim 17, wherein the HR mirror comprises a HR distributed Bragg reflector (DBR) mirror.

19. The DFB+R laser of claim 10, further comprising a modulation contact coupled to the active section and configured to provide a modulation signal to the active section to modulate the active section, wherein modulation of the active section modulates cavity loss of the DFB+R laser and increases carrier-photon resonance frequency ($F_r$) of the DFB+R laser.

20. The DFB+R laser of claim 10, further comprising a photon-photon resonance frequency separated from the lasing mode of the active section by a frequency separation of at least 25 gigahertz.

* * * * *